(12) United States Patent
Chang et al.

(10) Patent No.: US 12,086,414 B2
(45) Date of Patent: Sep. 10, 2024

(54) MANAGING CONTENT ADDRESSABLE MEMORY DEVICES

(71) Applicant: Macronix International Co., Ltd., Hsinchu (TW)

(72) Inventors: Chin-Hung Chang, Tainan (TW); Ken-Hui Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 79 days.

(21) Appl. No.: 17/961,176

(22) Filed: Oct. 6, 2022

(65) Prior Publication Data
US 2024/0118806 A1  Apr. 11, 2024

(51) Int. Cl.
*G06F 3/06* (2006.01)
*G11C 15/04* (2006.01)

(52) U.S. Cl.
CPC ............ *G06F 3/061* (2013.01); *G06F 3/0659* (2013.01); *G06F 3/0679* (2013.01); *G11C 15/04* (2013.01)

(58) Field of Classification Search
CPC ...... G06F 3/061; G06F 3/0659; G06F 3/0679; G11C 15/04
USPC ........................................................ 711/108
See application file for complete search history.

(56) References Cited

U.S. PATENT DOCUMENTS

| 8,013,762 B2 | 9/2011 | Matthews, Jr. et al. |
| 10,998,047 B1* | 5/2021 | Li .......................... G11C 15/04 |
| 2003/0174717 A1* | 9/2003 | Zabarski ................. H04L 45/00 370/466 |
| 2006/0078333 A1* | 4/2006 | Uga ........................ H04L 45/00 398/26 |
| 2007/0150497 A1 | 6/2007 | De La Cruz et al. |
| 2007/0260814 A1* | 11/2007 | Branscome ............ G11C 15/00 711/108 |
| 2014/0086249 A1* | 3/2014 | Assarpour ......... H04L 45/74591 370/392 |
| 2018/0247694 A1* | 8/2018 | Wickeraad ............. G11C 15/00 |

FOREIGN PATENT DOCUMENTS

WO   WO 2021/128217   7/2021

\* cited by examiner

*Primary Examiner* — Than Nguyen
(74) *Attorney, Agent, or Firm* — Fish & Richardson P.C.

(57) ABSTRACT

Systems, devices, methods, and circuits for managing content addressable memory (CAM) devices. In one aspect, a semiconductor device includes: a memory cell array configured to store data in memory cells, and a circuitry coupled to the memory cell array and configured to execute a search operation in the memory cell array according to a search instruction. The search instruction includes at least one of search data or an option code, and the option code specifies, for the search operation, at least one of a search length or a search depth.

38 Claims, 10 Drawing Sheets

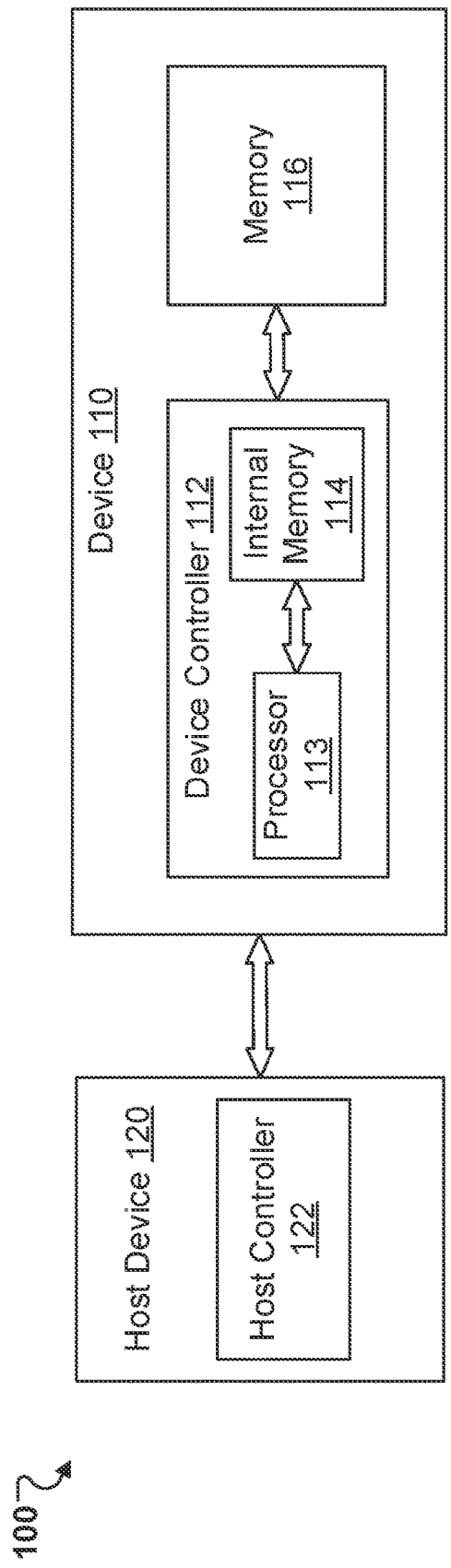
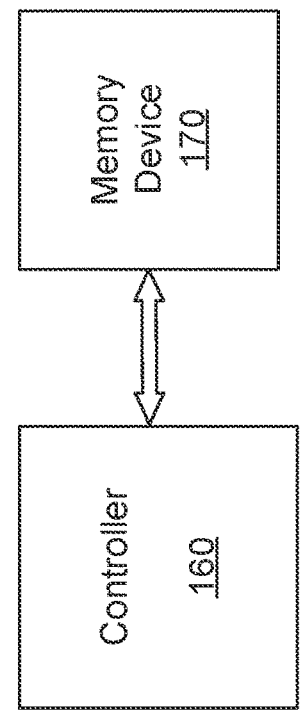
FIG. 1A
FIG. 1B (a)

| Frame | CMD | ADDR (starting address) | | | Option | DATA (input) |
|---|---|---|---|---|---|---|
| | | \multicolumn{4}{c}{TCAM Search-1 with data-in} | | |
| Data/Code | XXh | A[31:24] | A[23:16] | A[15:8] | A[7:0] | OP | Data + Mask |
| Length | 1 Byte | \multicolumn{4}{c}{4 Byte} | variable | depends on SLR |

(b)

| Frame | CMD | R/B | Match Flag | DATA (output) |
|---|---|---|---|---|
| | | | | Read highest priority matching address |
| | | | | Match address |
| Data/Code | XXh | | | A[31:24] | A[23:16] | A[15:8] | A[7:0] |
| Length | 1 Byte | | | 4 Byte |

Write data register

| Frame | CMD | Option | DATA (input) |
|---|---|---|---|
| Data/Code | XXh | OP | Data + Mask |
| Length | 1 Byte | variable | depends on SLR |

(b)

TCAM Search-2 with DR

| Frame | CMD | ADDR (starting address) | | | | Option |
|---|---|---|---|---|---|---|
| | | A[31:24] | A[23:16] | A[15:8] | A[7:0] | OP |
| Data/Code | XXh | | 4 Byte | | | variable |
| Length | 1 Byte | | | | | |

(c)

Read highest priority matching address

| Frame | CMD | R/B | DATA (output) | | | | | | | | |
|---|---|---|---|---|---|---|---|---|---|---|---|
| | | | Match Flag of 1st search | Match address of 1st search | | | | Match Flag of 2nd search | Match address of 2nd search | | |
| | | | | A[31:24] | A[23:16] | A[15:8] | A[7:0] | | A[31:24] | A[23:16] | A[15:8] | A[7:0] |
| Data/Code | XXh | | | | 4 Byte | | | | | 4 Byte | |
| Length | 1 Byte | | | | | | | | | | |

(d)

R/B

| Bit 2~N | Bit 1 | Bit 0 |
|---|---|---|
| Indicator of each search | R/B of 2nd search | R/B of 1st search |

FIG. 6

TCAM Search

| Frame | | | | | | |
|---|---|---|---|---|---|---|
| Data/Code | CMD | ADDR (starting address) | | | Option | DATA (input) | Dummy | DATA (output) |
| | XXh | A[31:24] | A[23:16] | A[7:0] | OP | Data + Mask | Dummy | Match Flag + ADDR |
| Length | 1 Byte | 4 Byte | | | variable | depends on SLR | variable | N*5 Byte |

FIG. 8

(a) TCAM Search-1 with data-in

| Frame | | | | | | |
|---|---|---|---|---|---|---|
| Data/Code | CMD | ADDR (starting address) | | | Option | DATA (input) |
| | XXh | A[31:24] | A[23:16] | A[15:8] | A[7:0] | OP | Data + Mask |
| Length | 1 Byte | 4 Byte | | | | variable | depends on SLR and search times |

(b) Read highest priority matching address

| Frame | | | |
|---|---|---|---|
| Data/Code | CMD | R/B | DATA (output) |
| | | | Match Flag of 1st search | Match address of 1st search | Match Flag of 2nd search | Match address of 2nd search |
| | XXh | | | A[31:24] | A[23:16] | A[15:8] | A[7:0] | | A[31:24] | A[23:16] | A[15:8] | A[7:0] |
| Length | 1 Byte | | 4 Byte | | | | | 4 Byte | | | |

FIG. 9

MANAGING CONTENT ADDRESSABLE MEMORY DEVICES

BACKGROUND

Content addressable memory (CAM) is a type of memory that can perform a search operation in which a data string may be input as search content and the resulting output is an address of a location in the memory that stores matching data. Certain CAMs may be able to perform both a search operation and a read operation, while non-CAM memories may be able to perform a read operation but not a search operation. Therefore, it is highly desirable to develop high-density, high-speed, and high-bandwidth CAM devices.

SUMMARY

The present disclosure describes methods, devices, systems, and techniques for managing content addressable memory (CAM) devices, e.g., non-volatile Ternary CAM (TCAM) devices such as NOR flash memory devices.

One aspect of the present disclosure features a semiconductor device including: a memory cell array configured to store data in memory cells and a circuitry coupled to the memory cell array and configured to execute a search operation in the memory cell array according to a search instruction. The search instruction includes at least one of search data or an option code, and the option code specifies, for the search operation, at least one of a search length or a search depth.

In some embodiments, the search instruction includes a search address in the memory cell array. In some embodiments, the option code includes a selection of a search data register storing the search data.

In some embodiments, the circuitry is configured to generate a search result based on the execution of the search operation, the search result including at least one memory address in the memory cell array corresponding to the search data.

In some embodiments, the circuitry includes at least one of a search length register for storing search length information, a search depth register for storing search depth information, or at least one search data register for storing search data information.

In some embodiments, the option code includes a series of bits including at least one of: one or more first bits configured to define a specific search depth stored in the search depth register, one or more second bits configured to define a specific search length stored in the search length register, or one or more third bits configured to define a specific search data register among the at least one search data register.

In some embodiments, the memory cell array includes a series of data units associated with respective memory addresses, and the circuitry is configured to execute the search operation in the memory cell array by sequentially moving to a series of memory addresses and executing a series of search runs on corresponding data individually following the series of memory addresses.

In some embodiments, each data unit includes a number of data bits in the memory cell array, and the respective memory address includes a series of address bits, and the search length is N times of the number of data bits in the data unit, and where last (N−1) address bits in the series of address bits of the respective memory address are in a wildcard state in the search operation.

In some embodiments, for each of the series of memory addresses and each of the series of search runs, the corresponding data includes N times of the number of data bits. In some embodiments, the search address is a first memory address among the series of memory addresses, and the search length defines a length of the corresponding data in each of the series of search runs, and the search depth defines a number of the series of memory addresses.

In some embodiments, the circuitry is configured to identify, among the series of memory addresses, a specific memory address associated with specific data having a highest matching degree with the search data as a highest priority matching address for the search operation.

In some embodiments, the circuitry is configured to determine a value of a flag based on a result of determining whether the specific data having the highest matching degree exactly matches with the search data.

In some embodiments, the circuitry is configured to determine the value of the flag to be 1 if the specific data having the highest matching degree exactly matches with the search data, or 0 if the specific data having the highest matching degree does not exactly match with the search data.

In some embodiments, the search result includes at least one of: the highest priority matching address for the search operation, or the value of the flag for the highest priority matching address.

In some embodiments, the search instruction further includes a first command indicating executing the search operation in the memory cell array, and the search result further includes a second command indicating reading out the search result.

In some embodiments, the search data includes actual data and mask data corresponding to the actual data. The actual data includes a series of bits, and the mask data includes a same number of bits as the actual data, each bit in the mask data specifying whether a corresponding bit in the actual data is a wildcard bit, and the search length defines the number of bits in the actual data.

In some embodiments, the search instruction includes: a first instruction including at least one of the search data or a first option code specifying a selection of a specific search data register for storing the search data, and a second instruction including the search address and a second option code specifying the search length, the search depth, and the selection of the specific search data register. In some embodiments, the second instruction is received at a later time than the first instruction by the circuitry.

In some embodiments, the search instruction includes multiple first instructions to store multiple sets of search data in multiple search data registers. The second option code specifies, among the multiple search data registers, selections of at least two search data registers including: a first search data register storing first search data for a first search session, and a second search data register storing second search data for a second search session.

In some embodiments, the first search session and the second search session have a same search address, a same search length, and a same search depth that are specified by the second option code.

In some embodiments, the search result includes: a first highest priority matching address for the first search session, and a first flag value indicating whether first data corresponding to the first highest priority matching address exactly matches with the first search data, and a second highest priority matching address for the second search session, and a second flag value indicating whether second data corresponding to the second highest priority matching address exactly matches with the second search data.

In some embodiments, the search result further includes ready/busy status information storing multiple bits for corresponding multiple search sessions in the search operation, the multiple bits including: a first bit indicating a ready/busy status of the first search session, and a second bit indicating a ready/busy status of the second search session.

In some embodiments, the search instruction includes: the search address and the option code specifying the selection of the search data register storing the search data, and a search command indicating executing the search operation by performing a series of search sessions each based on at least one of a predetermined search depth or a predetermined search length, or a configured search depth or a configured search length by a command from a controller coupled to the semiconductor device.

In some embodiments, the search command further indicates sequentially reading out search results of the series of search sessions subsequent to the search instruction. In some embodiments, the search instruction includes one or more dummy cycles between the search instruction and an output of the search results of the series of search session. In some embodiments, the search result of each of the series of search sessions includes a respective highest priority matching address and a respective flag value for the respective highest priority matching address. In some embodiments, the search instruction further includes the search data.

In some embodiments, the search instructions includes: a first instruction including the search data and a first option code specifying the search data register for storing the search data, and a second instruction including the search address and the option code specifying the selection of the search data register. The second instruction can be received at a later time than the first instruction.

In some embodiments, the option code further specifies a number of search sessions in the search operation, and the search instruction includes respective sets of search data for the search sessions, and the search result includes multiple search session results for the search sessions, each search session result including a respective highest priority matching address and a respective flag value for the respective highest priority matching address.

In some embodiments, the semiconductor device includes a non-volatile Ternary CAM (TCAM) device. The non-volatile TCAM device can include an NOR flash memory device.

In some embodiments, the circuitry is configured to: program input data and mask data corresponding to the input data in the memory cell array. The input data includes a series of bits, and the mask data includes a same number of bits as the input data, each bit in the mask data specifying whether a corresponding bit in the input data is a wildcard bit.

In some embodiments, the search address is a starting address in the memory cell array for the search operation.

Another aspect of the present disclosure features a system, including: a semiconductor device and a controller coupled to the semiconductor device. The semiconductor device includes: a memory cell array configured to store data in memory cells; and a circuitry coupled to the memory cell array and configured to execute a search operation in the memory cell array according to a search instruction. The search instruction includes at least one of search data or an option code, and where the option code specifies, for the search operation, at least one of a search length or a search depth.

In some embodiments, the search instruction includes a search address in the memory cell array. In some embodiments, the option code further specifies a selection of a search data register storing the search data.

In some embodiments, the circuitry is configured to output, to the controller, a search result based on the execution of the search operation, the search result including at least one memory address in the memory cell array corresponding to the search data.

In some embodiments, the semiconductor device and the controller communicate with each other according to a protocol. In some embodiments, at least one of search length information or search depth information is configured by a command from the controller or is pre-defined in the semiconductor device.

A further aspect of the present disclosure features a method, including: executing a search operation in a memory according to a search instruction, where the search instruction includes at least one of search data or an option code, and the option code specifies, for the search operation, at least one of a search length or a search depth; and generating a search result based on the executing of the search operation, the search result including at least one memory address in the memory corresponding to the search data.

In some embodiments, the method further includes: outputting the search result to a controller coupled to the memory.

In some embodiments, the search instruction includes a search address in the memory cell array. In some embodiments, the option code further specifies a selection of a search data register storing the search data.

Implementations of the above techniques include methods, systems, circuits, computer program products and computer-readable media. In one example, a method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 1A is a schematic diagram illustrating an example of a system including a memory that can be a content addressable memory (CAM) device, according to one or more embodiments of the present disclosure.

FIG. 1B is a schematic diagram illustrating another example of a system including a controller and a memory device that can be a CAM device, according to one or more embodiments of the present disclosure.

FIG. 5 illustrates an example of a first search protocol for a TCAM device, according to one or more embodiments of the present disclosure.

FIG. 6 illustrates an example of a second search protocol for a TCAM device, according to one or more embodiments of the present disclosure.

FIG. 8 illustrates an example of a fourth search protocol for a TCAM device, according to one or more embodiments of the present disclosure.

FIG. 9 illustrates an example of a fifth search protocol for a TCAM device, according to one or more embodiments of the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1C:
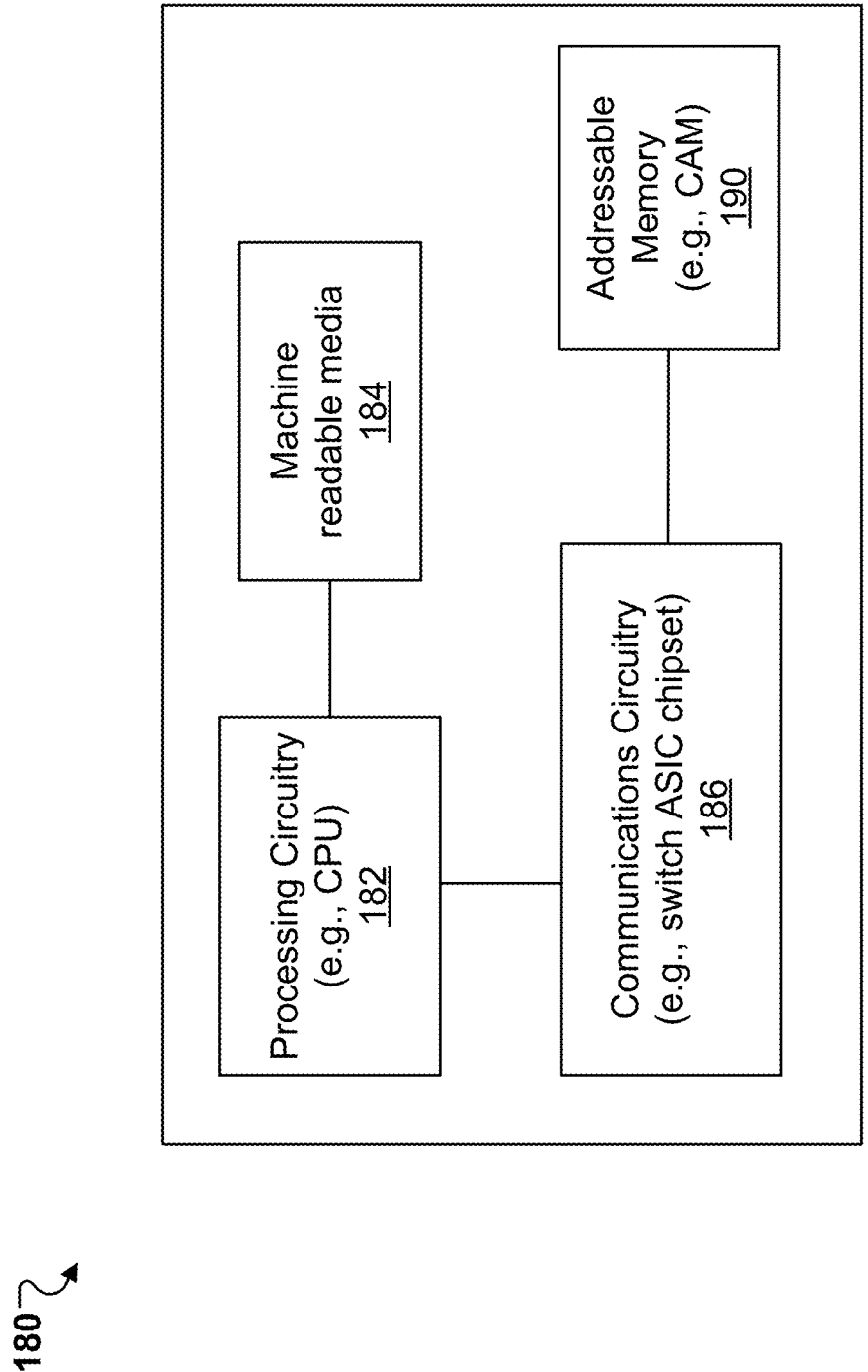
FIG. 1C is a schematic diagram illustrating another example of a system including an addressable memory, according to one or more embodiments of the present disclosure.

Implementations of the present disclosure provide techniques for managing content addressable memory (CAM) devices. The techniques can be applied to various types of CAM devices, e.g., Binary CAM devices, Ternary CAM (TCAM), among others. For illustration purposes, TCAM is described below as an example of a CAM device.

TCAM is a type of CAM in which bit cells can store a wildcard data value in addition to two binary data values. Such bit cells can be called as wildcard bits or don't care bits. When a bit cell that stores the wildcard value is searched, the result is a match regardless of what search criterion is used to search the bit cell. In some cases, TCAMs may also allow a search to be conducted on the basis of a wildcard search criterion. When a bit cell is searched based on the wildcard search criterion, the result is a match regardless of what value is stored in the bit cell.

It is highly desirable to develop high-density and high-bandwidth TCAM devices for various applications, e.g., high density lookup table, complex routing, and few-shot/one-shot learning applications enabled by TCAM devices. Non-volatile (or nonvolatile) memories, e.g., NOR flash memory devices, can provide excellent device characteristics, e.g., high density array and high speed, which can be used for high-density, high-speed, and high-bandwidth TCAM devices. Compared to volatile memory devices such as random access memory (RAM) devices, the non-volatile TCAM (nvTCAM) devices can save data movements and return the search result immediately without moving the data from a main memory or a storage memory, which can achieve high speed and be energy efficient.

The techniques herein provide protocols (e.g., communication protocols with controllers) and interface instructions for non-volatile TCAM devices, which can support different types of protocols, e.g., Serial Peripheral Interface (SPI). The techniques also provide various search protocols (or schemes) for non-volatile TCAM devices. Particularly, the techniques provide configurable searching by managing configuration registers (e.g., search length registers, search depth registers, and/or search data registers) in the TCAM devices. For example, the searching input protocols for the TCAM devices can contain search address (e.g., starting address), search length, search depth (or range), and/or search data, which can be configured through command input from controllers and/or pre-defined inside circuitry of memory chips. The search input protocols can store multiple search data inputs in multiple search data registers, which can be used for multiple searching in the memory chips. Search output protocols for the TCAM devices can contain one or more match flags and one or more matching addresses (or highest priority matching addresses) for one or more search data inputs. Thus, the techniques can achieve high-density, high-speed, and high-bandwidth TCAM devices.

The techniques can be applied to various types of non-volatile memory devices, such as NOR flash memory, NAND flash memory, among others. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, computing network devices such as network routers or network processors, cache controllers and translation lookaside buffers, lookup tables, database engines, data compression hardware, artificial neural networks, intrusion prevention systems, custom computer, among others.

Example Systems and Devices

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112. The memory 116 includes a plurality of blocks. The memory 116 can be a two-dimensional (2D) memory including 2D memory blocks. The memory 116 can also be a three-dimensional (3D) memory including 3D memory blocks.

The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller.

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime. The device controller 112 transfers the instruction code and/or the data from the memory 116 to the internal memory 114.

In some implementations, the memory 116 is a non-volatile memory that is configured for long-term storage of instructions and/or data, e.g., an NAND or NOR flash memory device, or some other suitable non-volatile memory device. The memory 116 can include one or more memory chips. In implementations where the memory 116 is an NAND flash memory, the device 110 is a flash memory device, e.g., a flash memory card, and the device controller 112 is an NAND flash controller. For example, in some implementations, when the device 110 is an eMMC or an SD card, the memory 116 is an NAND flash memory; in some implementations, when the device 110 is a digital camera, the memory 116 is an SD card; and in some implementations, when the device 110 is a media player, the memory 116 is a hard disk. In some implementations where the memory 116 is an NOR flash memory, the device 110 can optionally include the device controller 112. In some cases, the device 110 can include no device controller and the memory 116 can directly communicate with the host device 120. The memory 116 can be implemented as a non-volatile TCAM device.

FIG. 1B is a schematic diagram illustrating another example of a system 150 including a controller 160 and a memory device 170, according to one or more embodiments of the present disclosure. The controller 160 is coupled to the memory device 170 via an electrical connection, e.g., an electrical wire, pin or bus, or a wireless connection, and communicates, e.g., directly, with the memory device 170. The controller 160 can be the host controller 122 of FIG. 1A or the device controller 112 of FIG. 1A. The memory device 170 can be the memory 116 of FIG. 1A and be implemented as a non-volatile TCAM device.

In some embodiments, the in-memory parallel search nature of content addressable memory enables real-time monitoring of network traffic, and the CAM devices can be used in networking for rapid network IP lookups and access control lists (ACLs).

FIG. 1C is a schematic diagram illustrating another example of a system 180 including an addressable memory 190, according to one or more embodiments of the present disclosure. The addressable memory 190 can be the memory 116 of FIG. 1A or the memory device 170 of FIG. 1B, or any memory devices described with respect to FIGS. 2-10 (e.g., memory device 200 of FIG. 2). In some examples, the addressable memory 190 is a CAM device such as a TCAM device. The system 180 can include any number of different computing devices that are suitable for implementing content addressable memory, including but not limited to servers, network switches, gateway devices, among other devices.

In some embodiments, the system 180 includes a network device (e.g., switch, gateway, etc.). As shown in FIG. 1C, the system 180 includes the addressable memory 190, processing circuitry 182, machine readable media 184, and communications circuitry 186. The processing circuitry 182 is configured to supply a control signal or a command through the communications circuitry 186 to the addressable memory 190. The processing circuitry 182 can be any circuitry capable of executing non transitory machine-readable instructions, such as a central processing unit (CPU), a microprocessor, a microcontroller, a digital signal processor (DSP), etc. The machine-readable media 184 can be any non-transitory machine-readable medium, including but not limited to volatile storage media (e.g., dynamic RAM (DRAM), SRAM, etc.) and/or non-volatile storage media (e.g., PROM, EPROM, EEPROM, NVRAM, hard drives, etc.). The machine-readable media 184 can store machine-readable instructions that, when executed by processing circuitry 182, cause the system 180 to perform one or more operations, such as programming, searching, and reading operations.

The communications circuitry 186 can include transceiver circuitry for receiving input data communications and transmitting output data communications. In various embodiments, the communications circuitry 186 can include a network interface card (NIC) including a plurality of different communication ports in compliance with a plurality of different communication standards. In various embodiments, the communications circuitry 186 can include a plurality of communications ports, which can serve to connect multiple other electronic devices to one another via the system 180. In some examples, the communications circuitry 186 can be a network router, switch, gateway, or other routing device for a network, and may perform various traffic control tasks such as routing, switching, etc. The communications circuitry 186 can include an application-specific integrated circuit (ASIC), a field-programmable gate array (FPGA), an application-specific instruction set processor (ASIP), or the like, that is configured to perform certain operations. For example, the communications circuitry 186 can be a switch ASIC chipset.

In some embodiments, the communications circuitry 186 can determine which communication port to forward the received communication to based on the destination address identified in a received data packet. The system 180 can utilize the addressable memory 190 to identify the communications port to which to send a received data packet by searching the addressable memory 190 using a destination address in the received data packet. For example, the system 180 can be connected in a network to a plurality of other devices, each of the other devices having a unique address (e.g., a unique IP address). The system 180 can store this information in the addressable memory 190 such that the location of the stored device address within the addressable memory 190 corresponds to a specific communications port through which the system 180 and a particular other device are connected. Each stored word in the addressable memory 190 can correspond to a different communications port. In various embodiments, when a new device is connected to the system 180, the unique address for the newly-added device can be written to a data word of the addressable memory 190. Upon receipt of a new data communication (packet), a destination address included within the received data packet is extracted and sent to the addressable memory 190 directly from the communications circuitry 186 in some embodiments, while in other embodiments the destination address may be provided indirectly through the processing circuitry 182. The destination address serves as the input command for conducting the content addressable memory (CAM) search.

If a match is identified, the addressable memory 190 returns a memory address (e.g., a location within RAM) to the communications circuitry 186, either directly or through the processing circuitry 182. Because each data word of the addressable memory 190 corresponds to a particular communications port of the communications circuitry 186, the memory address of the stored data word associated storage block can be understood by communications circuitry to identify a particular communications port, and therefore the communications circuitry 186 can determine which communications port to forward the communication packet based on the output address of the addressable memory 190.

Example Memory Devices

Figure 2:
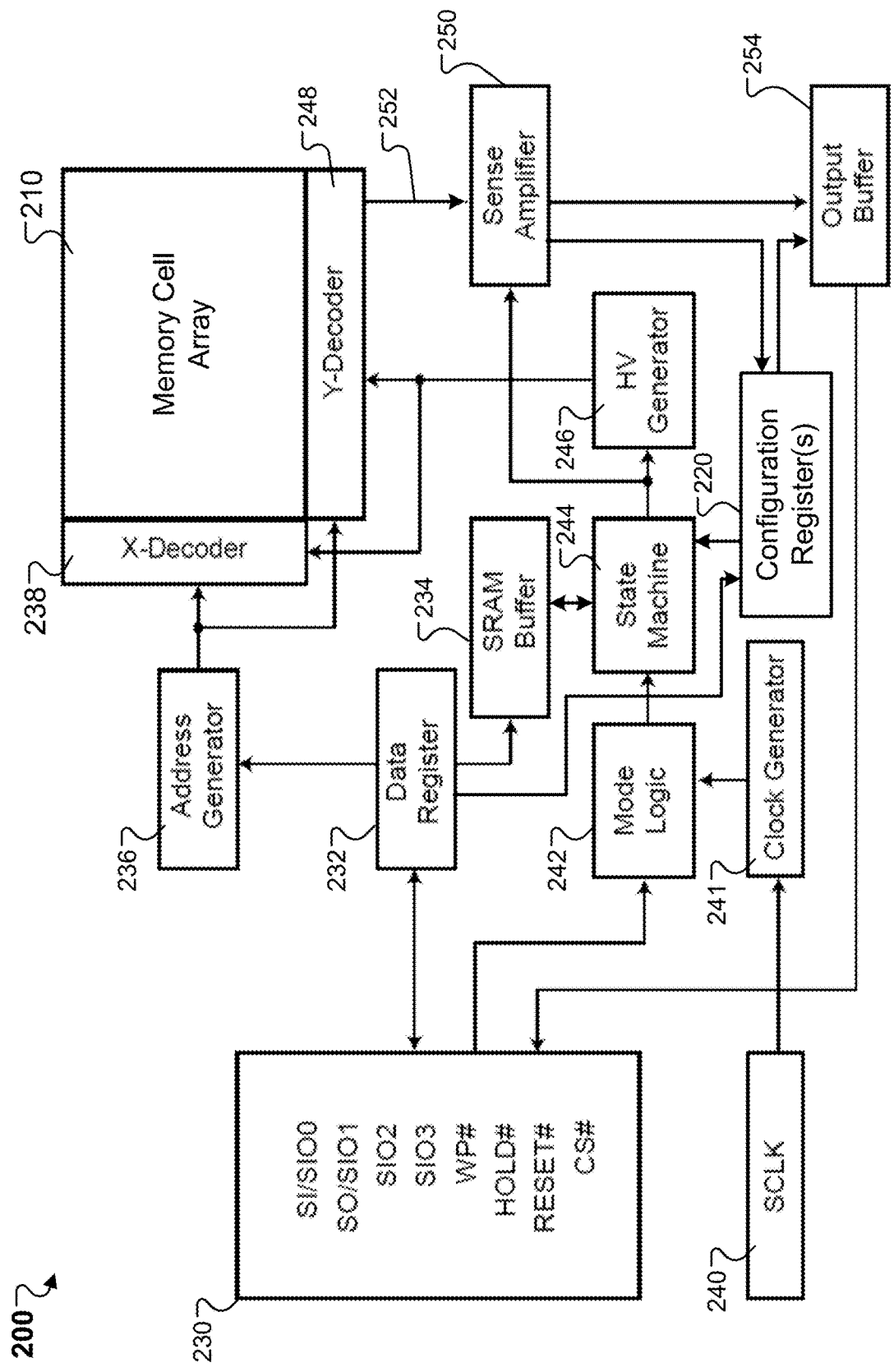
FIG. 2 is a schematic diagram illustrating an example of a memory device that can be a CAM device, according to one or more embodiments of the present disclosure.

FIG. 2 is a schematic diagram illustrating an example of a memory device 200, according to one or more embodiments of the present disclosure. The memory device 200 can be the memory 116 of FIG. 1A, the memory device 170 of FIG. 1B, or the addressable memory 190 of FIG. 1C. The memory device 200 can be implemented as a non-volatile TCAM device configured to perform programming operations and/or searching operations, as discussed with further details below.

As illustrated in FIG. 2, the memory device 200 includes a number of components that can be integrated onto a board, e.g., a Si-based carrier board, and be packaged. The memory device 200 can have a memory cell array 210 that can include a number of memory cells. The memory cells can be coupled in series to a number of row word lines and a number of column bit lines.

Each memory cell can include at least one memory transistor configured as a storage element to store data. The memory transistor can include a silicon-oxide-nitride-oxide-silicon (SONOS) transistor, a floating gate transistor, a nitride read only memory (NROM) transistor, or any suitable non-volatile memory MOS device that can store charges. In some embodiments, a memory cell is a memristor-based TCAM (mTCAM) cell that includes two memristors and two transistors. A memristor can be an electrical component that limits or regulates the flow of electrical current in a circuit and remembers the amount of charge that has previously flowed through it, and can be configured to store bits of information, 1 or 0.

The memory device 200 can include an X-decoder (or row decoder) 238 and optionally a Y-decoder (or column decoder) 248. Each memory cell can be coupled to the X-decoder 238 via a respective word line and coupled to the Y-decoder 248 via a respective bit line. Accordingly, each memory cell can be selected by the X-decoder 238 and the Y-decoder 248 for read or write operations through the respective word line and the respective bit line.

The memory device 200 can include a memory interface (input/ouput—I/O) 230 having multiple pins configured to be coupled to an external device, e.g., the device controller 112 and/or the host device 120 of FIG. 1A or the controller 160 of FIG. 1B. The memory interface 230 can be configured to support one or more types of TCAM protocols (e.g., communication protocols with the controller) and interface instructions. The memory interface 230 can be a Serial Peripheral Interface (SPI) or any other suitable interface.

In some embodiments, the pins in the memory interface 230 can include SI/SIO0 for serial data input/serial data input & output, SO/SIO1 for serial data output/serial data input & output, SIO2 for serial data input or output, SIO3 for serial data input or output, RESET #for hardware reset pin active low, CS #for chip select. The memory interface 230 can also include one or more other pins, e.g., WP #for write protection active low, and/or Hold #for a holding signal input.

The memory device 200 can include a data register 232, an SRAM buffer 234, an address generator 236, a synchronous clock (SCLK) input 240, a clock generator 241, a mode logic 242, a state machine 244, and a high voltage (HV) generator 246. The SCLK input 240 can be configured to receive a synchronous clock input and the clock generator 241 can be configured to generate a clock signal for the memory device 200 based on the synchronous clock input. The mode logic 242 can be configured to determine whether there is a read or write operation and provide a result of the determination to the state machine 244.

The memory device 200 can also include a sense amplifier 250 that can be optionally connected to the Y-decoder 248 by a data line 252 and an output buffer 254 for buffering an output signal from the sense amplifier 250 to the memory interface 230. The sense amplifier 250 can be part of read circuitry that is used when data is read from the memory device 200. The sense amplifier 250 can be configured to sense low power signals from a bit line that represents a data bit (1 or 0) stored in a memory cell and to amplify small voltage swings to recognizable logic levels so the data can be interpreted properly. The sense amplifier 250 can also communicate with the state machine 244, e.g., bidirectionally.

A controller, e.g., the host controller 122 or the device controller 112 of FIG. 1A or the controller 160 of FIG. 1B, can generate commands, such as read commands and/or write commands that can be executed respectively to read data from and/or write data to the memory device 200. Data being written to or read from the memory the array 210 can be communicated or transmitted between the memory device 200 and the controller and/or other components via a data bus (e.g., a system bus), which can be a multi-bit bus.

In some examples, during a read operation, the memory device 200 receives a read command from the controller through the memory interface 230. The state machine 244 can provide control signals to the HV generator 246 and the sense amplifier 250. The sense amplifier 250 can also send information, e.g., sensed logic levels of data, back to the state machine 244. The HV generator 246 can provide a voltage to the X-decoder 238 and the Y-decoder 248 for selecting a memory cell. The sense amplifier 250 can sense a small power (voltage or current) signal from a bit line that represents a data bit (1 or 0) stored in the selected memory cell and amplify the small power signal swing to recognizable logic levels so the data bit can be interpreted properly by logic outside the memory device 200. The output buffer 254 can receive the amplified voltage from the sense amplifier 250 and output the amplified power signal to the logic outside the memory device 200 through the memory interface 230.

In some examples, during a write operation, the memory device 200 receives a write command from the controller. The data register 232 can register input data from the memory interface 230, and the address generator 236 can generate corresponding physical addresses to store the input data in specified memory cells of the memory cell array 210. The address generator 236 can be connected to the X-decoder 238 and Y-decoder 248 that are controlled to select the specified memory cells through corresponding word lines and bit lines. The SRAM buffer 234 can retain the input data from the data register 232 in its memory as long as power is being supplied. The state machine 244 can process a write signal from the SRAM buffer 234 and provide a control signal to the HV generator 246 that can generate a write voltage and provide the write voltage to the X-decoder 238 and the Y-decoder 248. The Y-decoder 248 can be configured to output the write voltage to the bit lines for storing the input data in the specified memory cells. The state machine 244 can also provide information, e.g., state data, to the SRAM buffer 234. The SRAM buffer 234 can communicate with the output buffer 254, e.g., sending information or data out to the output buffer 254.

As illustrated in FIG. 2, the memory device 200 can include one or more configuration registers 220. The configuration register(s) 220 can be coupled to one or more components in the memory device 200, e.g., the data register 232, the state machine 244, the sense amplifier 250, and/or the output buffer 254. In some embodiments, the configuration register(s) 220 can be configurable through a command input from the controller, e.g., through the memory interface 230 and the data register 232. In some embodiments, the configuration register(s) 220 can be pre-defined in the memory cell array 210 or inside circuitry of the memory device 200, e.g., through the sense amplifier 250. The configuration register(s) 220 can store and provide information of search length, search depth, and/or search data string to the state machine 244 for generating corresponding control signals.

Figure 7:
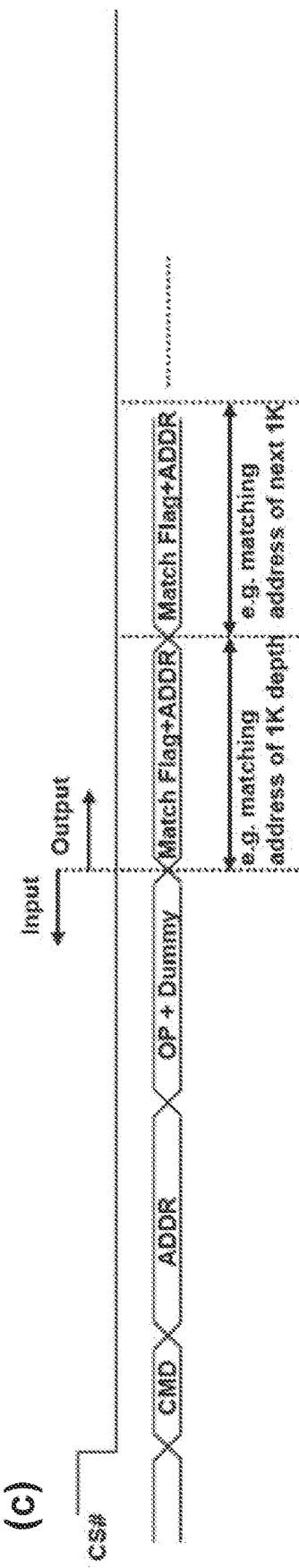
FIG. 7 illustrates an example of a third search protocol for a TCAM device, according to one or more embodiments of the present disclosure.

A search operation can include one or more search sessions. Each search session can include one or more search runs. Different search sessions can have different search data (e.g., as illustrated in FIGS. 6, 9) or a same search data (e.g., as illustrated in FIGS. 7, 8). A configuration register can include a search length register (SLR), a search depth register (SDR), or a search data register (DR). The SLR is configured to define a search length of a search run, e.g., 34 bits, 68 bits, or 136 bits. The SDR is configured to define a search depth or a search range of the search session or operation, e.g., 1 KB (kilobyte), 2 KB, or 4 KB. The DR is configured to store a search data (e.g., a data string for search) used to compare in search. The memory device 200 can include multiple search data registers to store multiple sets of search data for multiple search sessions together. The configuration register, e.g., SLR, SDR, and/or DR, can be configurable by option codes (OPs).

In some embodiments, an option code includes a number of bits that can include one or more first bits configured to define a specific search length stored in the search length register, one or more second bits configured to define a specific search depth stored in the search depth register, or one or more third bits configured to define a specific search data register among the at least one search data register. In a particular example, OP[1:0] defines SDR, OP[3:2] defines SLR, OP[5:4] defines a selection of a DR from multiple DRs. In some cases, if there are multiple search sessions in a search operation, e.g., as discussed with further details in FIG. 6, OP[5:4] can define a selection of a first DR from the multiple DRs for a first search session, and OP[7:6] can define a selection of a second DR from the multiple DRs for a second search session.

In a particular example, an option code includes 4 bits [3:0], where OP[1:0] defines SDR and OP[3:2] defines SLR. Table 1 illustrates an example SDR register storing search depth information, and Table 2 illustrates an example SLR register storing search length information. Thus, by setting bit values in the option code, search length and search depth can be specified. For example, OP[3:0][0000] defines SLR=00, SDR=00, which specifies the search length to be 34 bits and the search depth to be 1 KB. OP[3:0] defines SLR=01, SDR=10, which specifies the search length to be 68 bits and the search depth to be 4 K.

TABLE 1

| SDR | Search Depth |
|-----|--------------|
| 00  | 1 K          |
| 01  | 2 K          |
| 10  | 4 K          |
| 11  | 8 K          |

TABLE 2

| SLR | Search Length |
|-----|---------------|
| 00  | 34            |
| 01  | 68            |
| 10  | 136           |
| 11  | 272           |

In some cases, a search length and a search depth for a search operation can be specified in the option code from the controller, e.g., as illustrated with further details in FIGS. 5, 6, and 9. In some cases, a search length and a search depth for a search operation can be predefined in the memory device 200, e.g., as illustrated with further details in FIGS. 7 and 8. For example, the search length can be predetermined to be 34 bits, and the search depth for each search session can be predetermined to be 1 KB. The search operation can include multiple search sessions.

In some cases, search data and a search starting address are sent together with a command for a search operation to the memory device 200, and an option code can specify which search data register to store the search data, e.g., as illustrated with further details in FIGS. 5 and 8. In some cases, multiple sets of search data can be sent, separately or together, before sending a command for a search operation to the memory device 200. The multiple sets of search data can be stored in respective search data registers specified by respective option codes. Then, the command for the search operation can be sent with a search starting address and an option code specifying which search data register among the multiple search data registers for which search session among multiple search sessions in the search operation, e.g., as illustrated with further details in FIGS. 6, 7 and 9.

Example TCAM Instructions and Protocols

A non-volatile TCAM (nvTCAM) device, e.g., the memory 116 of FIG. 1A, the memory device 170 of FIG. 1B, the addressable memory 190 of FIG. 1C, or the memory device 200 of FIG. 2, can be managed with a number of instructions and/or protocols. The TCAM instructions and/or protocols can include communication protocols and/or search protocols with a controller, e.g., the host controller 122 or the device controller 112 of FIG. 1A, or the controller 160 of FIG. 1B. The communication protocols can include a Serial Peripheral Interface (SPI).

Table 3 shows an example of TCAM instructions with corresponding descriptions, and Table 4 shows example information for the TCAM instructions in Table 3.

TABLE 3

TCAM instructions

| Item | Instructions | Descriptions |
|---|---|---|
| 1 | Program nvTCAM | Program nvTCAM with input address and data |
| 2 | Read nvTCAM to data register | Read nvTCAM to data register with input address and read to which data register is selected by option code (OP) |
| 3 | Read data register | Read data from data register, and read from which data register is selected by OP |
| 4 | Program next blank address | Program input data to blank nvTCAM address |
| 5 | Move data register to next blank address | Program data stored in data register to blank nvTCAM address |
| 6 | Write data register | Write data to data register, and write to which data register is selected by OP |
| 7 | Search-1 with data-in | Search with input starting address, data and OP setting, and then polling status |
| 8 | Read highest priority matching address | Read ready/busy status and highest priority matching address after search |
| 9 | Search-2 with DR | Search with input starting address, OP setting and search data is stored in data register, and then polling status |
| 10 | Search-3 with DR | Search with input starting address, OP setting and search data is stored in data register, and then output result |

TABLE 4

TCAM instructions and protocols

| Item | Instructions | ADDR | OP/Dummy | DATA | Note |
|---|---|---|---|---|---|
| 1 | Program nvTCAM | 4-Byte | NA | Data + Mask | Read status register (RDSR) to ready |
| 2 | Read nvTCAM to data register | 4-Byte | OP | NA | RDSR to ready |
| 3 | Read data register | NA | OP | Data + Mask | Subsequent to Read nvTCAM |
| 4 | Program next blank address | NA | NA | Data + Mask | RDSR to ready |
| 5 | Move data register to next blank address | NA | OP | NA | RDSR to ready |
| 6 | Write data register | NA | OP | Data + Mask | OP defines DR |
| 7 | Search-1 with data-in | 4-Byte | OP | Data + Mask | RDSR to ready |
| 8 | Read highest priority matching address | NA | NA | R/B + Flag + ADDR (4-Byte) | Subsequent to Search-1 or Search-2 |
| 9 | Search-2 with DR | 4-Byte | OP | NA | RDSR to ready |
| 10 | Search-3 with DR | 4-Byte | OP + Dummy | Flag + ADDR (4-Byte) | Continuous read |

As shown in Table 3 and Table 4, instructions "Program nvTCAM," "Read nvTCAM to data register," "Read data register," "Program next blank address," and "Move DR to next blank address," can be related to programming operations. The instructions can be sent from the controller to the nvTCAM device.

Figure 3:
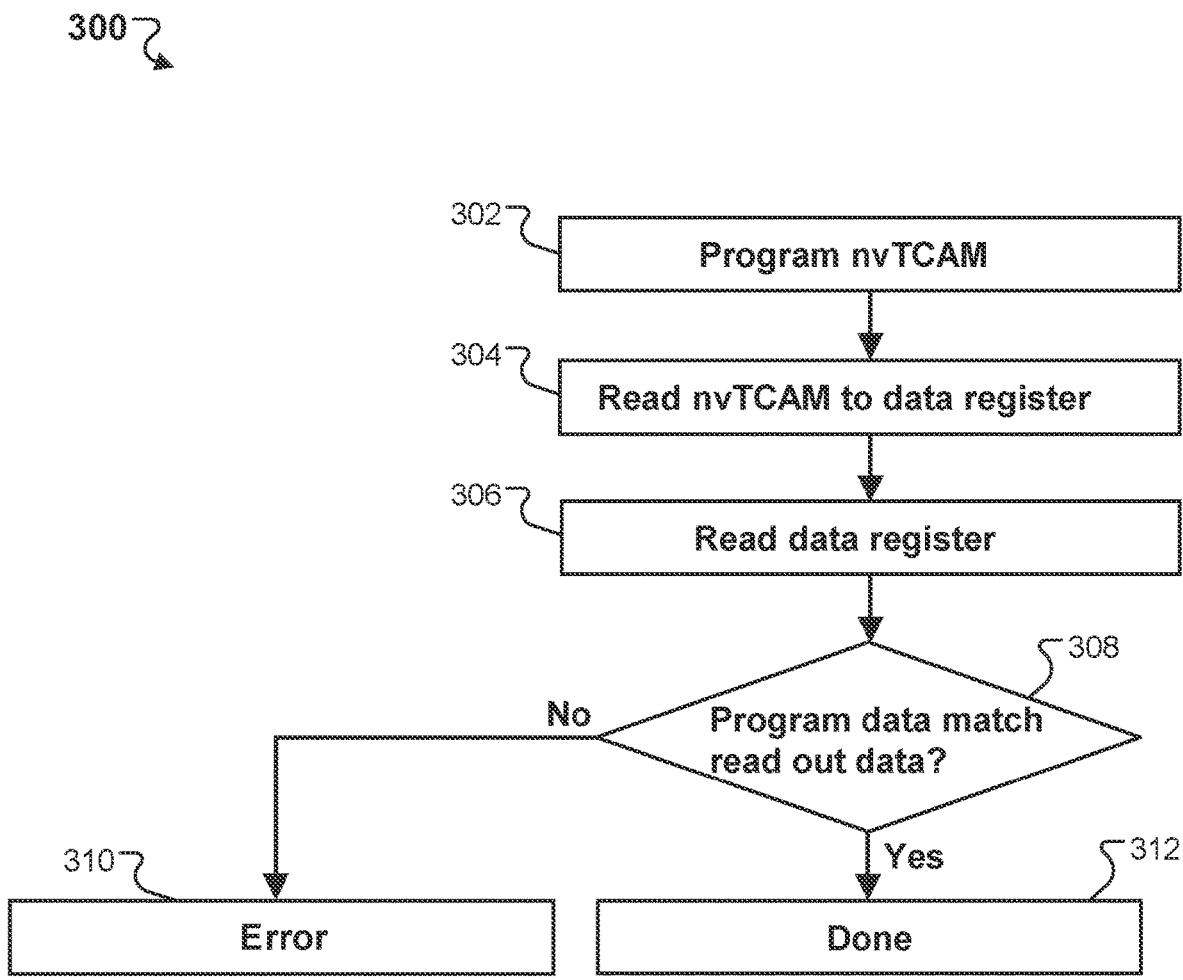
FIG. 3 is a flow chart of an example of a process for programming data in a TCAM device, according to one or more embodiments of the present disclosure.

FIG. 3 illustrates an example process 300 for programming data in the nvTCAM device. At 302, instruction "Program nvTCAM" is executed by programming memory cells in the nvTCAM device with input address and input data. The input address can be a starting address for programming the input data in a memory cell array of the nvTCAM device, e.g., the memory cell array 210 of FIG. 2. The input address can have a length of 4-Byte, e.g., A[31:24] A[23:16] A[15:8] A[7:0].

The input data can be programmed in the memory cell array with corresponding mask data. The mask data corresponds to the input data. For example, the input data can include a series of bits, e.g., 01100011, and the mask data can include a same number of bits as the input data, and each bit in the mask data specifies whether a corresponding bit in the input data is a wildcard bit (or don't care bit) for wildcard match. The wildcard bit can be represented by X that can have a value, either 0 or 1. For example, if the last two bits in the input data 01100011 are wildcard bits, the stored data can be represented by 011000XX. When a bit cell that stores the wildcard value is searched, the result is a match regardless of what search criterion is used to search the bit cell. After the input data is programmed in the nvTCAM device, the controller can send a read status register (RDSR) instruction to read the status of the nvTCAM device, e.g., a ready status.

In some embodiments, a program instruction does not include an input address. For example, instruction "Program next blank address" is executed by program the input data and corresponding mask data to the next blank address in the memory cell array of the nvTCAM device.

In some embodiments, a program instruction does not include input data. For example, instruction "Move data register to next blank address" is executed by programming data stored in the data register to the next blank address in the memory cell array of the nvTCAM device. The instruction can include an option code (OP) to select the data register from a number of data registers in the nvTCAM device.

At 304, instruction "Read nvTCAM to data register" is executed in the nvTCAM device by reading the stored data from the memory cell array based on the input address in the instruction "Program nvTCAM." The read out data can be read to a data register in the nvTCAM device. The instruction can include an option code (OP) to select the data register, among a number of data registers.

At 306, subsequent to instruction "Read nvTCAM to data register", instruction "Read data register" is executed by reading the read out data in the data register out to the controller. The instruction can include an option code (OP) to select the data register storing the read out data read from the memory cell array. The read out data can include both actual data stored in the nvTCAM device and corresponding mask data.

At 308, the controller compares the read out data with the input data in instruction "Program nvTCAM". If the read out data does not match with the input data, it indicates that the input data has not successfully programmed in the nvTCAM device, and the controller generates an error message at 310. The controller can further send another "Program nvTCAM" instruction to the nvTCAM device. If the read out data matches with the input data, it indicates that the input data has successfully programmed in the nvTCAM device. The programming operation is done at 312.

After data is successfully stored in the nvTCAM device, a TCAM search operation can be executed on stored data in the nvTCAM device based on search data. The search data is data or a content to be searched in the nvTCAM device. In some cases, the search data includes actual data, e.g., 01100011. In some cases, the search data includes actual data and mask data corresponding to the actual data. The mask data has a same number of bits as the actual data, and each bit in the mask data specifies whether a corresponding bit in the actual data is a wildcard bit (or a don't care bit). For example, the search data can be represented as 011001X, which indicates that the last bit in the search data can be any value, 0 or 1.

As noted above, a search length defines how long stored data are searched in a search run, and a search depth defines a data range to be searched in a search session (or operation) that can include multiple search runs. Thus, the search depth and the search length can determine the number of the multiple search runs in the search session (or operation). In some cases, the search length is N times of a length of the actual data in the search data, where N can be 1, 2, 4, or 8, any other integer. The memory cell array can store a number of data units associated with respective memory addresses. The respective memory address can be a starting memory address for the data unit. Each data unit can have a same length as the actual data in the search data.

The TCAM device can execute the search operation by sequentially moving to a series of memory addresses and executing the multiple search runs on corresponding data individually associated with the series of memory addresses. In some cases, in a TCAM search operation, an address associated with stored data that matches the most bits is the one selected as a search result, known as a longest-prefix matching address or a highest priority matching address. In some cases, a flag (or a match flag) is used to indicate whether the stored data associated with the highest priority matching address exactly matches the search data. If the stored data exactly matches the search data, the flag is set to "1". If the stored data does not exactly match the search data, the flag is set to "0."

As an example, in a TCAM search operation, the search data is 01100011. The search length is 8 bits, same as the length of the search data. The search depth is 32 bits, thus 4 search runs are performed by sequentially moving to Address 1, Address 2, Address 3, Address 4 and executing the search run on respective stored data, 011000XX, 0111000X, 01111100, and 10011011. As XX are wildcard bits, 011000XX exactly matches with the search data. Thus, the search result is Address 1 and the flag value is 1 that indicates an exact match.

As another example, if the search data is 01110101, among the stored data 011000XX, 0111000X, 01111100, and 10011011, 0111000X matches the most bits with the search data, but does not exactly match with the search data. Thus, the search result is Address 2, and the flag value is 0 that indicates not exactly match.

With continued reference to Table 3 and Table 4 above, Instruction "Write data register," "Search-1 with data-in," "Read highest priority matching address," "Search-2 with DR," and "Search-3 with DR" can be related to different searching operations or search protocols. The instructions can be sent from the controller to the nvTCAM device. These search instructions and search protocols are described with further details below.

Figure 4A:
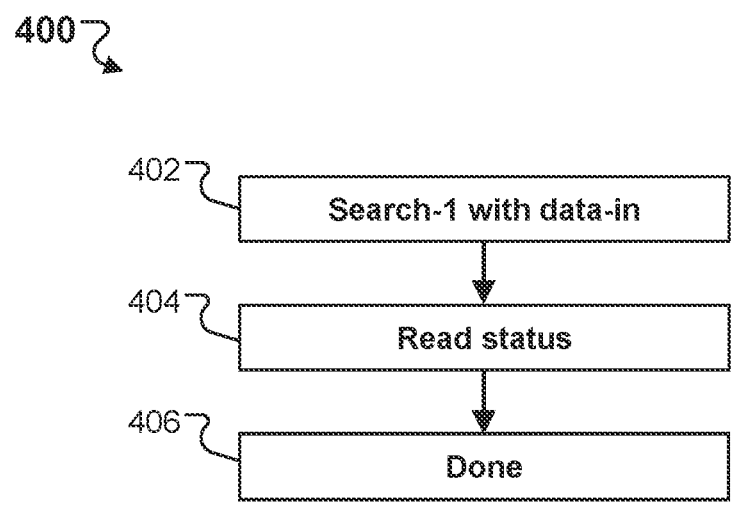
FIG. 4A is a flow chart of an example of a process for searching data in a TCAM device according to a first search protocol, according to one or more embodiments of the present disclosure.

Instruction "Search-1 with data-in" and "Read highest priority matching address" refer to a first search protocol, e.g., as illustrated with further details in FIGS. 4A and 5. Instruction "Write data register," "Search-2 with DR" and "Read highest priority matching address" refer to a second search protocol, e.g., as illustrated with further details in FIGS. 4B and 6. Instruction "Write data register" and "Search-3 with DR" refer to a third search protocol, e.g., as illustrated with further details in FIG. 7. FIG. 8 shows a fourth search protocol which is a variation of the third search protocol, and FIG. 9 shows a fifth search protocol which is a variation of the first search protocol.

FIG. 4A is a flow chart of an example of a process 400 for searching data in the TCAM device according to the first search protocol.

At 402, "Search-1 with data-in" instruction is executed in the TCAM device. The instruction can include a search starting address, a search data, and an option code (OP). As illustrated in FIG. 5(a), the search starting address ADDR has a length of 4 Byte, e.g., represented by A[31:24] A[23:16] A[15:8] A[7:0]. The OP can specify a search length, a search depth, and input search data. In some embodiments, at least one of the search length or the search depth can be predetermined or predefined in the TCAM device. The search instruction can also include a command (CMD) indicating executing the search operation.

The search data can include actual data and corresponding mask data. The actual data includes a number of bits, and the corresponding mask data includes the same number of bits as the actual data. For example, if the actual data has 34 bits, the mask data has 34 bits. The search length can be one or more times of the number of bits of the actual data, e.g., 1, 2, 4, 8. In some cases, the search length depends on the number of bits in the actual data. For example, if the actual data has 34 bits, the search length is N times of the 34 bits, e.g., 34 bits, 68 bits, 136 bits, or 272 bits. In some cases, the length of the search data depends on the search length. For example, if the search length is 34 bits, the search data includes 34 bits actual data plus 34 bits mask data. If the search length is 68 bits, the search data includes 68-bits actual data plus 68-bits mask data.

In some embodiments, the actual data in the search data has a number of bits (e.g., 34 bits), and a data unit associated with each memory address in a search run has the same number of bits. If the search length is N times of the number of bits of the data unit, then last (N−1) bits in the memory address are wildcard bits or don't care bits. For example, the memory address has 32 bits represented by A[31:24] A[23:16] A[15:8] A[7:0], and the data unit has 34 bits. If the search length is 68 bits, A0 is a don't care bit. If the search length is 136 bits, A0 and A1 are don't care bits.

At 404, the controller reads ready/busy (R/B) status and a highest priority matching address from the TCAM device by issuing instruction "Read highest priority matching address" to the TCAM device after executing the search operation at step 402. As illustrated in FIG. 5(b), a search result includes the highest priority matching address in the search operation and a match flag indicates whether data associated with the highest priority matching address exactly matches with the search data. The highest priority matching address can have a length of 4 Bytes, e.g., represented by A[31:24] A[23:16] A[15:8] A[7:0]. The instruction can also include a command (CMD) indicating reading out the search result. The process 400 is done at 406 once the search result is read out.

Figure 4B:
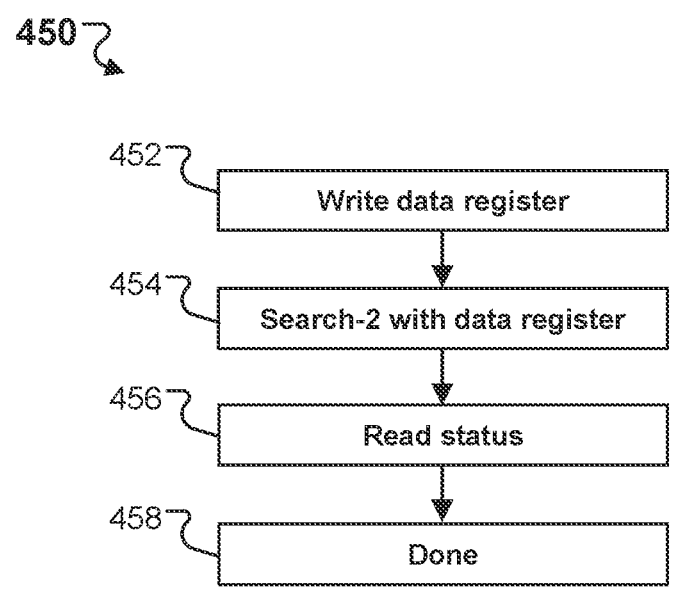
FIG. 4B is a flow chart of an example of a process for searching data in a TCAM device according to a second search protocol, according to one or more embodiments of the present disclosure.

FIG. 4B is a flow chart of an example of a process 450 for searching data in the TCAM device according to the second search protocol. Different from the first search protocol illustrated in FIGS. 4A and 5, in the second search protocol, one or more sets of search data are sent and stored in one or more corresponding data registers in the TCAM device first before the TCAM device receives a search instruction to perform a search operation. Separating search data input and search operation execution can provide flexibility for the TCAM device to prioritize tasks and/or to perform multiple search sessions in a search operation. The search operation can include one or more search sessions using the one or more different sets of search data, and the search result can also include one or more corresponding results for the one or more search sessions.

At 452, instruction "Write data register" is executed in the TCAM device by writing search data in a search data register specified by an option code (OP). As illustrated in FIG. 6(*a*), the instruction includes the option code and the search data. The instruction can also include a command (CMD) indicating executing the "Write data register" instruction in the TCAM device. The search data can include actual data and corresponding mask data. The option code can specify a selection of the search data register and a search length. For example, as noted above, the option code can include OP [3:2] that defines the search length and OP[5:4] that selects which search data register for the search data among multiple search data registers in the TCAM device.

In some embodiments, the controller sends multiple "Write data register" instructions to the TCAM device to store multiple sets of search data (that are different from each other) in corresponding search data registers in the TCAM device. In such a way, a search instruction can select one or more sets of search data for performing one or more corresponding search sessions in a search operation.

At 454, instruction "Search-2 with data register" is executed in the TCAM device. The instruction can include a search starting address and an option code (OP). As illustrated in FIG. 6(*b*), the search starting address ADDR has a length of 4 Byte, e.g., represented by A[31:24] A[23:16] A[15:8] A[7:0]. The OP can specify a search length, a search depth, and a selection of a search data register for storing search data. In some embodiments, at least one of the search length or the search depth can be predetermined or predefined in the TCAM device. The search instruction can also include a command (CMD) indicating executing the search operation. In some embodiments, the search operation includes multiple search sessions, and each search session is executed with respective search data from a respective search data register among the multiple search data registers. For example, the OP includes a number of bits, including OP [1:0] for defining the search depth, OP[3:2] for defining the search length, OP[5:4] for selecting a first search data register for a first search session, and OP[7:6] for selecting a second search data register for a second search session.

Each search session can be executed to be the same as, or similar to, executing "Search-1 with data-in" instruction at step 402 of FIG. 4A. In some cases, a search session is executed by sequentially moving to a series of memory addresses and executing the multiple search runs on corresponding data individually associated with the series of memory addresses. Each memory address can be a starting address for the corresponding data. For each search session, a highest priority matching address is identified and a value of a match flag for the highest priority matching address is determined.

In some embodiments, the first search session and the second search session are executed sequentially. For example, the first search session is executed from the search starting address (included in the search instruction) with the first search data. Once the first search session is executed completely, e.g., reaching the search depth, the second search session is executed again from the search starting address. In some embodiments, the first search session and the second search session are executed simultaneously. For example, starting the search starting address, a first search run in the first search session and a first search run in the second search session are performed simultaneously or sequentially. Once both of the first search runs in the first search session and the second search session are completed, the TCAM device moves to a next memory address and perform a second search run for each of the first search session and the second search session.

At 456, the controller reads, for each search session, a ready/busy (R/B) status and the highest priority matching address and the match flag from the TCAM device by executing instruction "Read highest priority matching address" after executing the search operation at step 454. As illustrated in FIG. 6(*c*), the search result includes a first match flag and a first highest priority matching address for the first search session and a second match flag and a second highest priority matching address for the second search session. Each highest priority matching address can have a length of 4 Bytes, e.g., represented by A[31:24] A[23:16] A[15:8] A[7:0]. The instruction can also include a command (CMD) indicating reading out the search result.

In some embodiments, the controller also obtains R/B status for each search session. For example, as illustrated in FIG. 6(*d*), the search operation includes N search sessions, and the R/B status of each of the N search session can be indicated by a respective bit, where "1" represents busy and "0" represents ready. When the R/B status is "0", it indicates that the search session is completed and the search result for the search session can be output. The process 450 is done at 458 once the search result is successfully read out.

FIG. 7 illustrates the third search protocol for the TCAM device. Similar to the second search protocol illustrated in FIG. 6, search data can be pre-stored in a search data register in the TCAM device by executing instruction "Write data register" in the TCAM device, as illustrated in FIG. 7(*a*). However, different from the first search protocol shown in FIG. 5 and the second search protocol shown in FIG. 6, the third search protocol automatically outputs a search result without receiving a read instruction from the controller. Further, at least one of the search length or the search depth is predefined or predetermined in the TCAM device or configured by a command from a controller, e.g., the host controller 122 of FIG. 1A, the device controller 112 of FIG. 1A, or the controller 160 of FIG. 1B. For example, the search length can be predefined to be 34 bits, and the search depth can be predefined to be 1 KB. Each search depth corresponds to a respective search session. The search operation can be continuously executed for a next search depth once a current search depth reaches. The search operation can be ended, e.g., after a predetermined time period or predetermined times of search sessions, or after the chip select (CS #) signal is off.

FIG. 7(*b*) shows an example of a search instruction for the third search protocol, e.g., instruction "Search-3 with DR" shown in Table 3 and Table 4. The search instruction includes a search starting address, option code (OP) and dummy cycles, and output search results. The OP specifies a selection of a search data register for corresponding search data from multiple data registers. The OP can be configured by a command from a controller, e.g., the host controller 122 of FIG. 1A, the device controller 112 of FIG. 1A, or the controller 160 of FIG. 1B. The multiple search sessions (with a predetermined search depth) can have the same search data specified in the OP. In some cases, the OP can specify a search length for the search operation. The search instruction can also include a command (CMD) indicating performing the search operation and outputting search results of the search sessions sequentially. For each search session, a search result can include a match flag and a highest priority matching address obtained in the search session.

FIG. 7(c) shows a timing diagram showing input and output of the TCAM device. Once the CS #signal is on, e.g., at a lower level, the TCAM device receives the search instruction including the CMD, the starting address, and the OP. After one or more dummy cycles, the TCAM device sequentially outputs a search result for each search session, e.g., a high priority matching address of 1 K search depth. The one or more dummy cycles are used to wait for generating the search result for one or more search sessions executed in the TCAM device. In some embodiments, the TCAM device sequentially outputs a search result for each search session after an input, without any dummy cycle.

FIG. 8 illustrates the fourth search protocol, which can be a variation of the third search protocol. Instead of separately sending search data from a search instruction, the fourth search protocol can be implemented by including the search data in the search instruction, similar to the first search protocol as illustrated in FIG. 5(a). As shown in FIG. 8, the search instruction can include a command, a search starting address, search data, an option code for a search length, dummy cycles, followed by outputting search results for search sessions.

FIG. 9 illustrates the fifth search protocol, which can be a variation of the first search protocol. Similar to the first search protocol shown in FIG. 5(a), the search instruction in the fifth search protocol can include a command, a search starting address, an option code, and search data, as illustrated in FIG. 9(a). However, different from the first search protocol, the fifth search protocol can include multiple sets of search data for multiple search sessions in the search instruction. The option code can include a number of bits, including OP [1:0] for defining a search depth, OP[3:2] for defining a search length, and OP[5:4] defines how many times of searches or a number of the multiple search sessions.

As discussed above, the multiple search sessions can be sequentially or simultaneously performed in the TCAM device. Once the multiple search sessions are completed, the controller can read R/B status and search results for the multiple search sessions, similar to step 456 of FIG. 4B. FIG. 9(b) shows example output search result, which can be similar to those illustrated in FIG. 6(c) and/or (d).

Example Process

Figure 10:
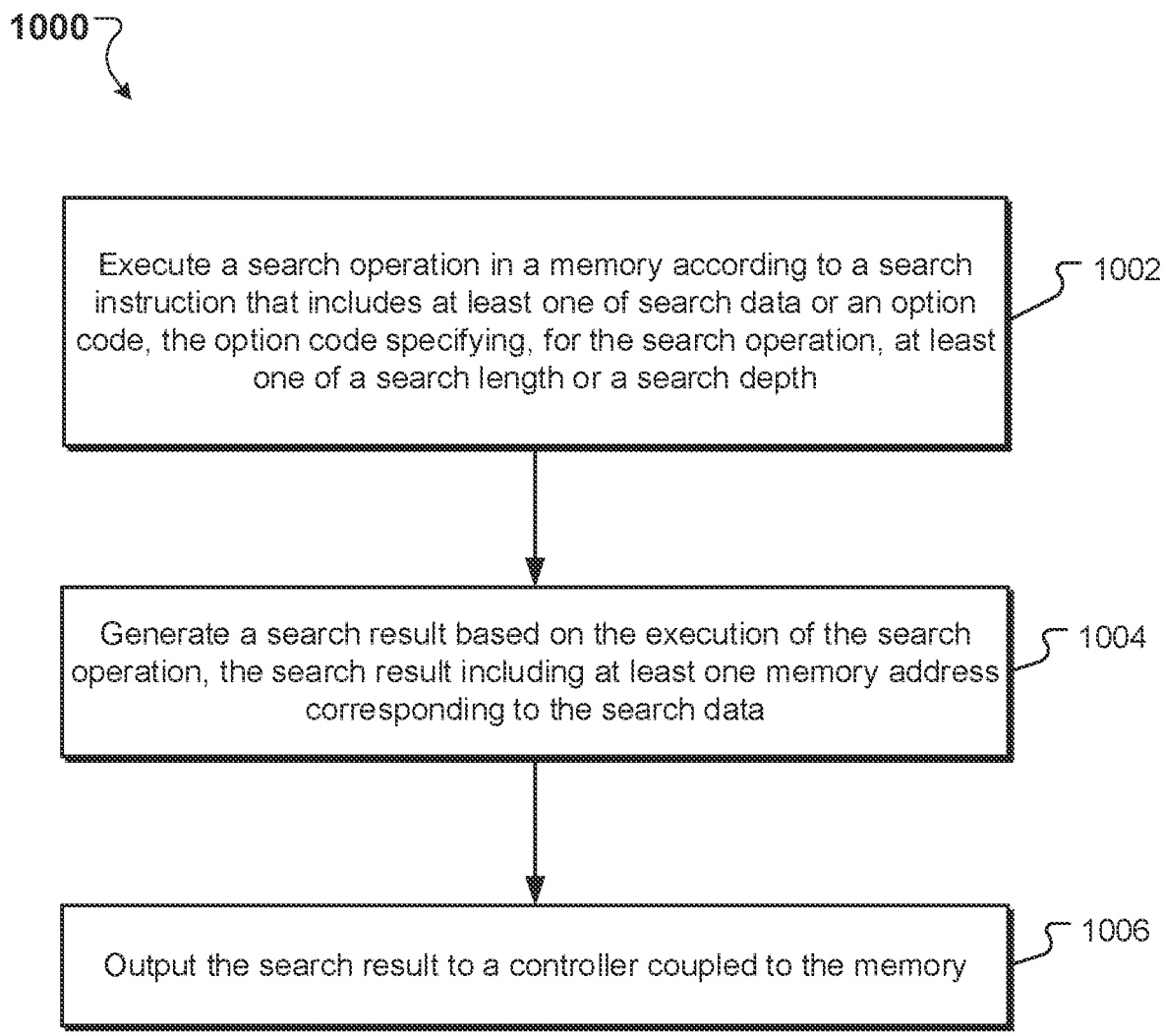
FIG. 10 is a flow chart of an example of a process for managing search in a memory device, according to one or more embodiments of the present disclosure.

FIG. 10 is a flow chart of an example of a process 1000 for managing a search operation in a semiconductor device, according to one or more embodiments of the present disclosure. The process 1000 can be performed by the semiconductor device, e.g., the memory 116 of FIG. 1A, the memory device 170 of FIG. 1B, or the addressable memory 190 of FIG. 1C, the memory device 200 of FIG. 2, or the TCAM device as described with respect to FIGS. 3 to 9. The semiconductor device can be a content addressable memory (CAM) device, e.g., a non-volatile TCAM device such as a NOR flash memory device.

The semiconductor device can include a memory cell array (e.g., the memory cell array 210 of FIG. 2) and a circuitry coupled to the memory cell array. The circuitry can include one or more components in the memory device 200 of FIG. 2, e.g., configuration registers 220, interface 230, data register 232, SRAM buffer 234, address generator 236, X-decoder 238, mode logic 242, state machine 244, HV generator 246, Y-decoder 248, sense amplifier 250, and/or output buffer 254. The circuitry can be a logic circuitry.

A controller can be coupled to the semiconductor device. The controller can be the host controller 122 or the device controller 112 of FIG. 1A or the controller 160 of FIG. 1B, or the controller as described with respect to FIGS. 2 to 9. The semiconductor device and the controller can communicate with each other according to a protocol. The protocol can include Serial Peripheral Interface (SPI). The protocol can be a search protocol, which can be same as, or similar to, the search protocol as described with respect to FIGS. 3 to 9. The semiconductor device can be managed by instructions and protocols illustrated in Table 3 and Table 4.

In some embodiments, as described in FIG. 3, the circuitry is configured to program input data and optionally mask data corresponding to the input data in the memory cell array. The input data can include a series of bits, and the mask data includes a same number of bits as the input data. Each bit in the mask data can specify or indicate whether a corresponding bit in the input data is a wildcard bit.

At 1002, the semiconductor device executes a search operation in the memory cell array according to a search instruction. The search instruction includes at least one of search data or an option code. The option code specifies, for the search operation, at least one of a search length or a search depth. The search instruction can further include a search address in the memory cell array. The option code can further specify, for the search operation, a selection of a search data register storing the search data.

At 1004, the semiconductor device generates a search result based on the execution of the search operation. The search result includes at least one memory address in the memory cell array corresponding to the search data.

At 1006, the semiconductor device outputs the search result to the controller, e.g., in response to receive a read command from the controller. The read command can be similar to the read status instruction as described in FIGS. 4A and 4B or "read highest priority matching address" instruction as described in Table 3 and Table 4.

In some embodiments, the circuitry includes at least one of a search length register (SLR) for storing search length information, a search depth register (SDR) for storing search depth information, or at least one search data register (DR) for storing search data information. The search address can be a starting address in the memory cell array for the search operation. The option code can include a series of bits including at least one of: one or more first bits (e.g., OP[1:0]) configured to define a specific search depth stored in the SDR, one or more second bits (e.g., OP[3:2]) configured to define a specific search length stored in the SLR, or one or more third bits (e.g., OP[5:4]) configured to define a specific search data register among the at least one search data register.

In some embodiments, the memory cell array includes a series of data units associated with respective memory addresses. Each respective memory address can be a starting address for a corresponding data unit. The circuitry can be configured to execute the search operation in the memory cell array by sequentially moving to a series of memory addresses and executing a series of search runs on corresponding data individually following the series of memory addresses. The search address in the search instruction can be a first memory address among the series of memory addresses, and the search length defines a length of the corresponding data in each of the series of search runs, and the search depth defines a number of the series of memory addresses.

In some embodiments, each data unit includes a number of data bits (e.g., 34 bits) in the memory cell array, and the respective memory address includes a series of address bits, e.g., 32 bits represented by A[31:24] A[23:16] A[15:8] A[7:0]. The search length can be N times of the number of data bits in the data unit, and last (N−1) address bits in the series of address bits of the respective memory address can be in a wildcard state in the search operation. For example, if the search length is 68 bits and the data unit has 34 bits, A0 in the respective memory address is a wildcard bit for the search operation. For each of the series of memory addresses and each of the series of search runs, the corresponding data can include N times of the number of data bits. That is, the corresponding data has a length same as the search length.

In some embodiments, generating the search result includes identifying, among the series of memory addresses, a specific memory address associated with specific data having a highest matching degree with the search data as a highest priority matching address for the search session or search operation.

In some embodiments, generating the search result further includes determining a value of a flag based on a result of determining whether the specific data having the highest matching degree exactly matches with the search data. If the specific data having the highest matching degree exactly matches with the search data, the value of the flag can be determined to be 1; if the specific data having the highest matching degree does not exactly match with the search data, the value of the flag can be determined to be 0.

In some embodiments, as illustrated in FIG. 5(b), FIG. 6(c), FIG. 7(b)(c), or FIG. 9(b), the search result includes at least one of: the highest priority matching address for the search operation, or the value of the flag for the highest priority matching address.

In some embodiments, e.g., as illustrated in FIG. 6(c) or 9(b), the search result includes: a first highest priority matching address for the first search session, and a first flag value indicating whether first data corresponding to the first highest priority matching address exactly matches with the first search data, and a second highest priority matching address for the second search session, and a second flag value indicating whether second data corresponding to the second highest priority matching address exactly matches with the second search data.

In some embodiments, as illustrated in FIG. 5(a), 6(b) or 9(a), the search instruction further includes a first command indicating executing the search operation in the memory cell array. As illustrated in FIG. 5(b), 6(c), or 9(b), the search result further includes a second command indicating reading out the search result. In some embodiments, as illustrated in FIG. 7(b), 7(c) or 8, the search instruction can include a command for both data in and data out.

In some embodiments, the search data includes actual data and mask data corresponding to the actual data. The actual data includes a series of bits, and the mask data includes a same number of bits as the actual data, each bit in the mask data specifying whether a corresponding bit in the actual data is a wildcard data value. The search length can define the number of bits in the actual data.

In some embodiments, the search instruction includes: a first instruction including the search data and a first option code specifying a selection of a specific search data register for storing the search data, e.g., as illustrated in FIG. 6(a) or 7(a) and a second instruction including the search address and a second option code specifying at least one of the search length, the search depth, or the selection of the specific search data register, e.g., as illustrated in FIG. 6(b). The second instruction can be received at a later time than the first instruction by the circuitry.

In some embodiments, the search instruction includes multiple first instructions to store multiple sets of search data in multiple search data registers. The second option code specifies, among the multiple search data registers, selections of at least two search data registers including: a first search data register storing first search data for a first search session, and a second search data register storing second search data for a second search session. The first search session and the second search session can have a same search address, a same search length, and a same search depth that are specified by the second option code.

In some embodiments, the search instruction includes: the search address and the option code specifying the selection of the search data register storing the search data, and a search command indicating executing the search operation by performing a series of search sessions each based on at least one of a predetermined search depth or a predetermined search length, e.g., as described with respect to FIG. 7 or 8.

In some embodiments, the search command further indicates sequentially reading out search results of the series of search sessions subsequent to the search instruction. In some embodiments, the search instruction includes one or more dummy cycles between the search instruction and an output of the search results of the series of search session, e.g., as illustrated in FIG. 7(b) or 7(c) or FIG. 8. The search result of each of the series of search sessions can include a respective highest priority matching address and a respective flag value for the respective highest priority matching address.

In some embodiments, as illustrated in FIG. 8, the search instruction further includes the search data. In some embodiments, the search instructions includes: a first instruction including the search data and a first option code specifying the search data register for storing the search data, and a second instruction including the search address and the option code specifying the selection of the search data register. The second instruction is received at a later time than the first instruction.

In some embodiments, the option code further specifies a number of search sessions in the search operation, and the search instruction includes respective sets of search data for the search sessions. The search result includes multiple search session results for the search sessions, each search session result including a respective highest priority matching address and a respective flag value for the respective highest priority matching address, e.g., as illustrated in FIG. 6(c) or FIG. 9(b).

In some embodiments, the search result further includes ready/busy status information storing multiple bits for corresponding multiple search sessions in the search operation. The multiple bits can include: a first bit indicating a ready/busy status of the first search session, and a second bit indicating a ready/busy status of the second search session, e.g., as illustrated in FIG. 6(d).

In some embodiments, at least one of search length information or search depth information is configured by a command from the controller or is pre-defined in the semiconductor device.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
   a memory cell array configured to store data in memory cells; and
   a circuitry coupled to the memory cell array and configured to execute a search operation in the memory cell array according to a search instruction,
   wherein the search instruction comprises at least search data and an option code, and wherein the option code specifies, for the search operation, at least one of a search length or a search depth,
   wherein the search operation comprises one or more search sessions, and each search session comprises one or more search runs, and
   wherein the search length defines a length of stored data to be searched in a search run, and the search depth defines a data range to be searched in a search session or in the search operation.

2. The semiconductor device of claim 1, wherein the search instruction further comprises a search address in the memory cell array.

3. The semiconductor device of claim 2, wherein the search address is a starting address in the memory cell array for the search operation.

4. The semiconductor device of claim 1, wherein the option code comprises a selection of a search data register storing the search data.

5. The semiconductor device of claim 1, wherein the circuitry is configured to generate a search result based on execution of the search operation, the search result comprising at least one memory address in the memory cell array corresponding to the search data.

6. The semiconductor device of claim 1, wherein the circuitry comprises at least one of
   a search length register for storing search length information,
   a search depth register for storing search depth information, or
   at least one search data register for storing search data information.

7. The semiconductor device of claim 6, wherein the option code comprises a series of bits including at least one of:
- one or more first bits configured to define a specific search depth stored in the at least one search depth register,
- one or more second bits configured to define a specific search length stored in the at least one search length register, or
- one or more third bits configured to define a specific search data register among the at least one search data register.

8. The semiconductor device of claim 1, wherein the memory cell array comprises a series of data units associated with respective memory addresses, and
- wherein the circuitry is configured to execute the search operation in the memory cell array by sequentially moving to a series of memory addresses and executing a series of search runs on corresponding data individually following the series of memory addresses.

9. The semiconductor device of claim 8, wherein each data unit comprises a number of data bits in the memory cell array, and the respective memory address comprises a series of address bits, and
- wherein the search length is N times of the number of data bits in the data unit, and wherein last (N−1) address bits in the series of address bits of the respective memory address are in a wildcard state in the search operation.

10. The semiconductor device of claim 8, wherein the circuitry is configured to identify, among the series of memory addresses, a specific memory address associated with specific data having a highest matching degree with the search data as a highest priority matching address for the search operation.

11. The semiconductor device of claim 10, wherein the circuitry is configured to determine a value of a flag based on a result of determining whether the specific data having the highest matching degree exactly matches with the search data.

12. The semiconductor device of claim 11, wherein the circuitry is configured to generate a search result based on execution of the search operation, and wherein the search result comprises at least one of:
- the highest priority matching address for the search operation, or
- the value of the flag for the highest priority matching address.

13. The semiconductor device of claim 1, wherein the search instruction further comprises a first command indicating executing the search operation in the memory cell array, and
- wherein the circuitry is configured to generate a search result based on execution of the search operation, and wherein the search result comprises a second command indicating reading out the search result.

14. The semiconductor device of claim 1, wherein the search data comprises actual data and mask data corresponding to the actual data,
- wherein the actual data comprises a series of bits, and the mask data comprises a same number of bits as the actual data, each bit in the mask data specifying whether a corresponding bit in the actual data is a wildcard bit, and
- wherein the search length defines the number of bits in the actual data.

15. The semiconductor device of claim 1, wherein the search instruction comprises:
- a first instruction comprising at least one of the search data or a first option code specifying a selection of a specific search data register for storing the search data, and
- a second instruction comprising a search address and a second option code specifying the search length, the search depth, and the selection of the specific search data register.

16. The semiconductor device of claim 15, wherein the search instruction comprises multiple first instructions to store multiple sets of search data in multiple search data registers, and
- wherein the second option code specifies, among the multiple search data registers, selections of at least two search data registers comprising:
  - a first search data register storing first search data for a first search session, and
  - a second search data register storing second search data for a second search session.

17. The semiconductor device of claim 16, wherein the circuitry is configured to generate a search result based on execution of the search operation, and wherein the search result comprises:
- a first highest priority matching address for the first search session, and a first flag value indicating whether first data corresponding to the first highest priority matching address exactly matches with the first search data, and
- a second highest priority matching address for the second search session, and a second flag value indicating whether second data corresponding to the second highest priority matching address exactly matches with the second search data.

18. The semiconductor device of claim 17, wherein the search result further comprises ready/busy status information storing multiple bits for corresponding multiple search sessions in the search operation, the multiple bits comprising:
- a first bit indicating a ready/busy status of the first search session, and
- a second bit indicating a ready/busy status of the second search session.

19. The semiconductor device of claim 1, wherein the search instruction comprises:
- a search address and the option code specifying a selection of a search data register storing the search data, and
- a search command indicating executing the search operation by performing a series of search sessions each based on at least one of a predetermined search depth or a predetermined search length, or a configured search depth or a configured search length by a command from a controller coupled to the semiconductor device.

20. The semiconductor device of claim 19, wherein the search command further indicates sequentially reading out search results of the series of search sessions subsequent to the search instruction.

21. The semiconductor device of claim 20, wherein the search instruction comprises one or more dummy cycles between the search instruction and an output of the search results of the series of search sessions.

22. The semiconductor device of claim 20, wherein a search result of each of the series of search sessions comprises a respective highest priority matching address and a respective flag value for the respective highest priority matching address.

23. The semiconductor device of claim 19, wherein the search instruction further comprises the search data.

24. The semiconductor device of claim 19, wherein the search instruction comprises:
a first instruction comprising the search data and a first option code specifying the search data register for storing the search data, and
a second instruction comprising the search address and the option code specifying the selection of the search data register,
wherein the second instruction is received at a later time than the first instruction.

25. The semiconductor device of claim 1, wherein the option code further specifies a number of search sessions in the search operation, and the search instruction comprises respective sets of search data for the search sessions, and
wherein the circuitry is configured to generate a search result based on execution of the search operation, and wherein the search result comprises multiple search session results for the search sessions, each search session result comprising a respective highest priority matching address and a respective flag value for the respective highest priority matching address.

26. The semiconductor device of claim 1, wherein the semiconductor device comprises a non-volatile Ternary CAM (TCAM) device.

27. The semiconductor device of claim 26, wherein the non-volatile TCAM device comprises an NOR flash memory device.

28. The semiconductor device of claim 1, wherein the circuitry is configured to:
program input data and mask data corresponding to the input data in the memory cell array,
wherein the input data comprises a series of bits, and the mask data comprises a same number of bits as the input data, each bit in the mask data specifying whether a corresponding bit in the input data is a wildcard bit.

29. A system, comprising:
a semiconductor device comprising:
a memory cell array configured to store data in memory cells; and
a circuitry coupled to the memory cell array and configured to execute a search operation in the memory cell array according to a search instruction; and
a controller coupled to the semiconductor device,
wherein the search instruction comprises at least search data and an option code, and wherein the option code specifies, for the search operation, at least one of a search length or a search depth,
wherein the search operation comprises one or more search sessions, and each search session comprises one or more search runs, and
wherein the search length defines a length of stored data to be searched in a search run, and the search depth defines a data range to be searched in a search session or in the search operation.

30. The system of claim 29, wherein the semiconductor device and the controller communicate with each other according to a protocol.

31. The system of claim 29, wherein at least one of search length information or search depth information is configured by a command from the controller or is pre-defined in the semiconductor device.

32. The system of claim 29, wherein the search instruction further comprises a search address in the memory cell array.

33. The system of claim 29, wherein the option code comprises a selection of a search data register storing the search data.

34. The system of claim 29, wherein the circuitry is configured to generate a search result based on execution of the search operation, the search result comprising at least one memory address in the memory cell array corresponding to the search data.

35. A method, comprising:
executing a search operation in a memory according to a search instruction, wherein the search instruction comprises at least search data and an option code, and wherein the option code specifies, for the search operation, at least one of a search length or a search depth, wherein the search operation comprises one or more search sessions, and each search session comprises one or more search runs, and wherein the search length defines a length of stored data to be searched in a search run, and the search depth defines a data range to be searched in a search session or in the search operation; and
generating a search result based on the executing of the search operation, the search result comprising at least one memory address in the memory corresponding to the search data.

36. The method of claim 35, further comprising:
outputting the search result to a controller coupled to the memory.

37. The method of claim 35, wherein the search instruction further comprises a search address in the memory.

38. The method of claim 35, wherein the option code comprises a selection of a search data register storing the search data.

* * * * *